United States Patent
Takahashi (10) Patent No.: US 11,451,319 B2
(45) Date of Patent: Sep. 20, 2022

(54) HIGH-FREQUENCY SIGNAL TRANSMISSION-RECEPTION CIRCUIT

(71) Applicant: Murata Manufacturing Co., Ltd., Kyoto (JP)

(72) Inventor: Kazuhiro Takahashi, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 16 days.

(21) Appl. No.: 17/103,175

(22) Filed: Nov. 24, 2020

(65) Prior Publication Data

US 2021/0159998 A1 May 27, 2021

(30) Foreign Application Priority Data

Nov. 25, 2019 (JP) .............................. JP2019-212586

(51) Int. Cl.
*H04K 3/00* (2006.01)
*H03F 3/24* (2006.01)
*H04B 1/40* (2015.01)

(52) U.S. Cl.
CPC .............. *H04K 3/22* (2013.01); *H03F 3/245* (2013.01); *H04B 1/40* (2013.01); *H03F 2200/294* (2013.01); *H03F 2200/451* (2013.01)

(58) Field of Classification Search
CPC ..... H04K 3/22; H03F 3/245; H03F 2200/294; H03F 2200/451; H03F 3/195; H04B 1/40; H04B 1/401; H04B 1/525
See application file for complete search history.

(56) References Cited

U.S. PATENT DOCUMENTS

| | | | |
|---|---|---|---|
| 2008/0107093 A1* | 5/2008 | Meiyappan | H04B 1/1036 370/339 |
| 2013/0021113 A1 | 1/2013 | Bakalski et al. | |
| 2015/0236798 A1* | 8/2015 | Nobbe | H03F 3/195 370/278 |
| 2017/0288633 A1 | 10/2017 | Asada et al. | |
| 2018/0138927 A1 | 5/2018 | Nagumo et al. | |
| 2019/0097605 A1 | 3/2019 | Nosaka | |
| 2019/0173564 A1* | 6/2019 | Li | H04B 7/0825 |

FOREIGN PATENT DOCUMENTS

| | | |
|---|---|---|
| CN | 102891698 A | 1/2013 |
| JP | H11-145754 A | 5/1999 |
| JP | 2000-114906 A | 4/2000 |
| JP | 2009-021725 A | 1/2009 |
| WO | 2016/170708 A1 | 10/2016 |
| WO | 2017/013910 A1 | 1/2017 |

* cited by examiner

*Primary Examiner* — Nguyen T Vo
(74) *Attorney, Agent, or Firm* — Pearne & Gordon LLP (57) ABSTRACT

A high-frequency circuit includes a transmission circuit that transmits a high-frequency signal, a reception circuit that receives a high-frequency signal, and a multiplexer that separates a reception path and a transmission path for high-frequency signals. In the reception circuit, a filter circuit in which a first frequency response and a second frequency response different from the first frequency response can be switched in accordance with a jamming wave for a high-frequency signal to be received is provided in the reception path for a high-frequency signal.

12 Claims, 8 Drawing Sheets

HIGH-FREQUENCY SIGNAL TRANSMISSION-RECEPTION CIRCUIT

CROSS REFERENCE TO RELATED APPLICATION

This application claims priority from Japanese Patent Application No. 2019-212586 filed on Nov. 25, 2019. The content of this application is incorporated herein by reference in its entirety.

BACKGROUND

The present disclosure relates to a high-frequency signal transmission-reception circuit. In mobile communication terminal devices (hereinafter simply referred to as "terminals"), such as mobile phone devices and smartphones, a front-end circuit is provided between an antenna and a radio frequency integrated circuit (RFIC). In recent years, in the front-end circuit, to achieve high-speed data communication and stable communication in addition to multiband support and multimode support in which multiple frequencies and wireless modes are supported by a single terminal, an increase in bandwidth is attempted by carrier aggregation (CA) (for example, International Publication No. 2017/013910).

In the above related art, a switch element or filter element that blocks a harmonic component is provided in a transmission path using a time division duplex (TDD) scheme, thereby keeping the harmonic component from flowing into a reception signal path. In a configuration in which a CA operation is performed by using a frequency division duplex (FDD) scheme, a surface acoustic wave (SAW) multiplexer that separates a transmission path and a reception path is typically provided, but a harmonic of a transmission signal is superimposed on the reception path across the SAW multiplexer, resulting in the possibility of deterioration of reception sensitivity.

BRIEF SUMMARY

The present disclosure has been made in view of the above to implement a high-frequency signal transmission-reception circuit that enables, in a configuration in which transmission and reception are simultaneously performed by using at least one antenna, deterioration of reception sensitivity to be suppressed.

A high-frequency signal transmission-reception circuit according to one aspect of the present disclosure includes a high-frequency circuit configured to perform transmission and reception of high-frequency signals by using one or more antennas. The high-frequency circuit includes a transmission circuit configured to transmit a high-frequency signal, a reception circuit configured to receive a high-frequency signal, and a multiplexer configured to separate a reception path and a transmission path for high-frequency signals. In the reception circuit, a filter circuit in which a first frequency response and a second frequency response different from the first frequency response can be switched in accordance with a jamming wave for a high-frequency signal to be received is provided in the reception path for a high-frequency signal.

The present disclosure can provide the high-frequency signal transmission-reception circuit that enables, in a configuration in which transmission and reception are simultaneously performed by using at least one antenna, deterioration of reception sensitivity to be suppressed.

Other features, elements, characteristics and advantages of the present disclosure will become more apparent from the following detailed description of embodiments of the present disclosure with reference to the attached drawings.

DETAILED DESCRIPTION

A high-frequency signal transmission-reception circuit according to embodiments will be described in detail below with reference to the drawings. Note that the present disclosure is not to be limited by these embodiments. Each embodiment is illustrative, and it goes without necessarily saying that configurations described in different embodiments can be partially replaced or combined. In Embodiment 2, a description of things in common with Embodiment 1 is omitted, and only respects in which Embodiment 2 differs from Embodiment 1 will be described. In particular, similar function effects achieved by similar configurations are not described one by one in each embodiment.

Embodiment 1

Figure 1:
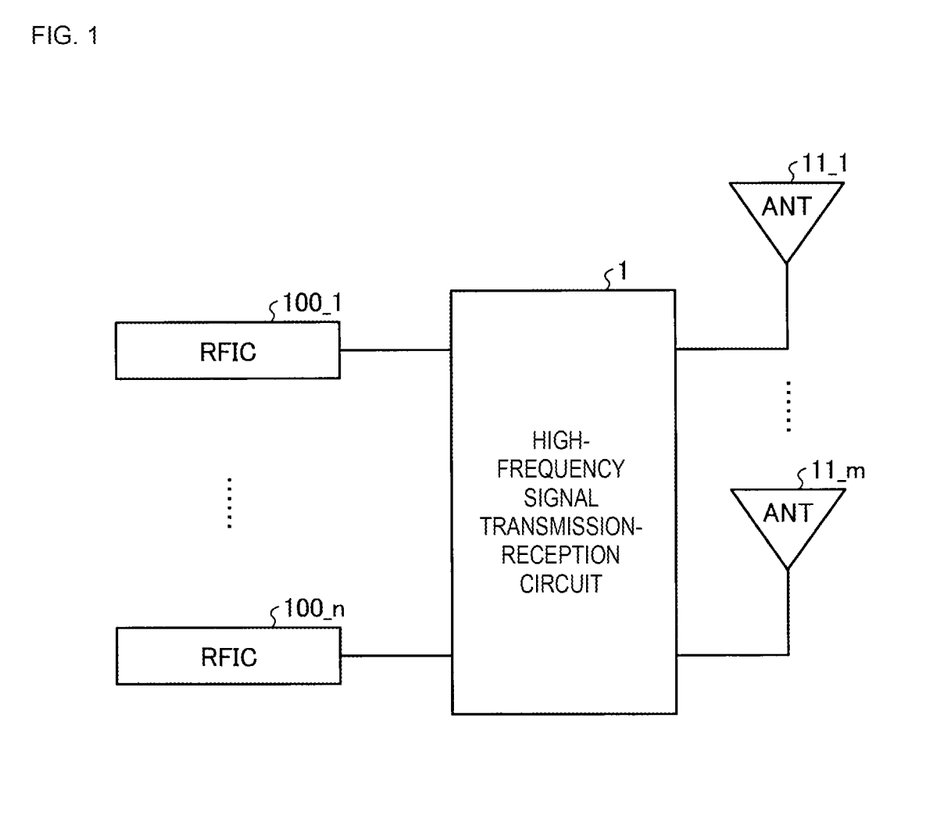
FIG. 1 illustrates an example of a schematic configuration of a system using a high-frequency signal transmission-reception circuit according to Embodiment 1.

FIG. 1 illustrates an example of a schematic configuration of a system using a high-frequency signal transmission-reception circuit according to Embodiment 1. A high-frequency signal transmission-reception circuit 1 is a front-end circuit that is provided between antennas (ANTs) 11_1 to 11_m (where m is a natural number) and radio frequency integrated circuits (RFICs) 100_1 to 100_n in a mobile communication terminal device (hereinafter simply referred to as "terminal"), such as a mobile phone device or smartphone. Furthermore, if the ANTs 11_1 to 11_m do not have to be distinguished from one another, each of the ANTs 11_1 to 11_m is referred to as an ANT 11. If the RFICs 100_1 to 100_n do not have to be distinguished from one another, each of the RFICs 100_1 to 100_n is referred to as an RFIC 100.

An RFIC 100 processes high-frequency signals to be transmitted and received via the high-frequency signal transmission-reception circuit 1 and an ANT 11. Incidentally, the number m of ANTs 11 does not necessarily have to be equal to the number n of RFICs 100. Furthermore, a plurality of RFICs 100 may be implemented as one integrated circuit (IC).

Figure 2:
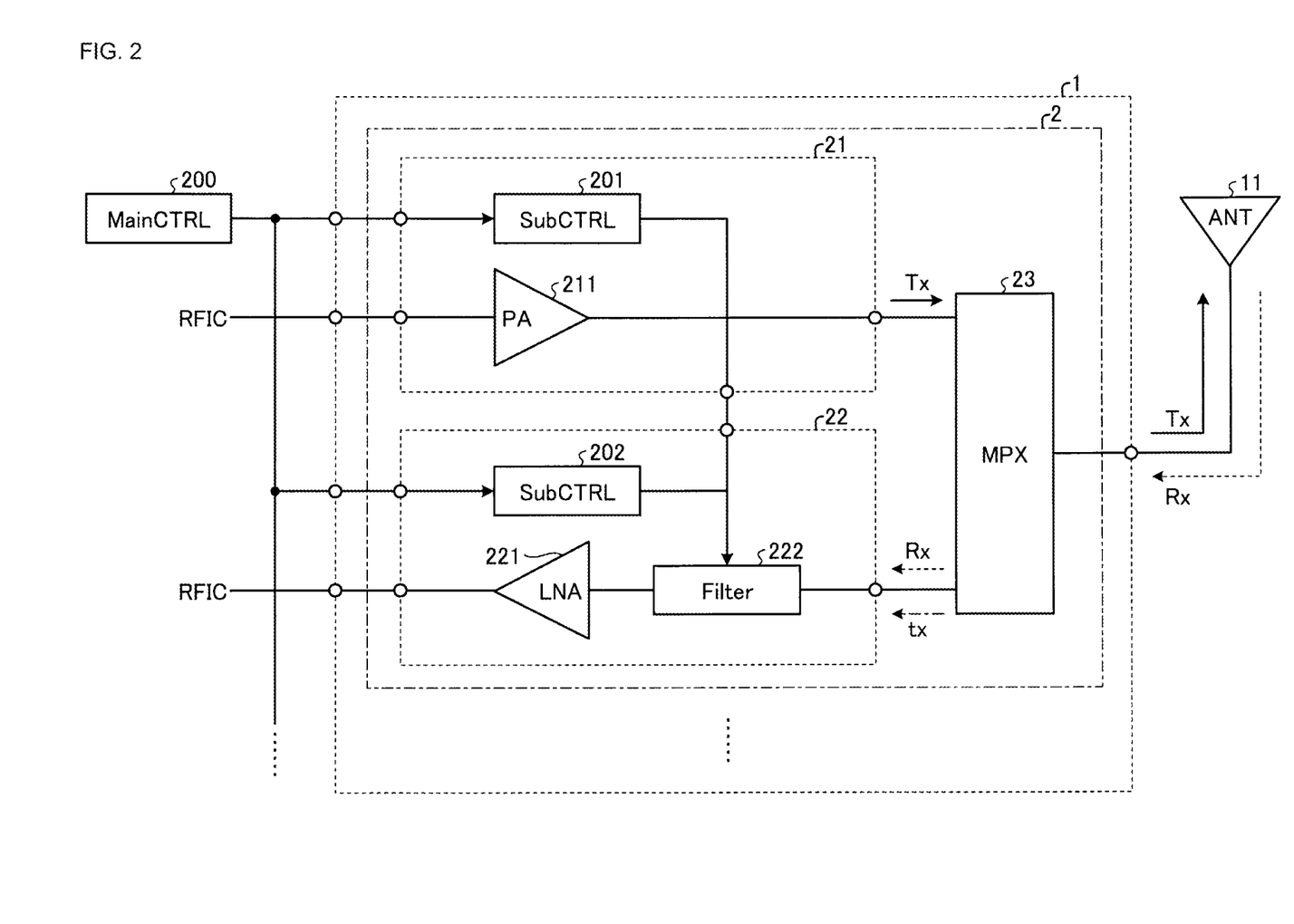
FIG. 2 illustrates an example of a schematic block configuration of the high-frequency signal transmission-reception circuit according to Embodiment 1.

FIG. 2 illustrates an example of a schematic block configuration of the high-frequency signal transmission-reception circuit according to Embodiment 1. The high-frequency signal transmission-reception circuit 1 includes at least one high-frequency circuit 2. FIG. 2 illustrates one high-frequency circuit 2. The high-frequency circuit 2 is provided so as to correspond to at least one ANT 11. In other words, the number of high-frequency circuits 2 is equal to at least the number of ANTs 11.

In this embodiment, as illustrated in FIG. 2, the high-frequency circuit 2 included in the high-frequency signal transmission-reception circuit 1 includes a transmission circuit 21 that transmits a high-frequency signal, a reception circuit 22 that receives a high-frequency signal, and a multiplexer (MPX) 23 that separates a reception path and a transmission path for high-frequency signals. The high-frequency circuit 2 performs simultaneous transmission and reception by using one or more ANTs 11. Specifically, the high-frequency circuit 2 performs a carrier aggregation (CA) operation, for example, by using a frequency division duplex (FDD) scheme. Hereinafter, a high-frequency signal to be transmitted in the transmission circuit 21 is referred to as a transmission signal Tx, and a high-frequency signal to be received in the reception circuit 22 is referred to as a reception signal Rx.

The high-frequency circuit 2 included in the high-frequency signal transmission-reception circuit 1 is not limited to the configuration illustrated in FIG. 2. For example, the high-frequency circuit 2 may include only a transmission circuit or may include only a reception circuit. Furthermore, for example, the high-frequency circuit 2 may include a plurality of reception circuits or may include a plurality of transmission circuits.

The transmission circuit 21 includes at least a power amplifier circuit (PA) 211 and at least a sub-controller (SubCTRL) 201. The PA 211 amplifies a transmission signal Tx output from an RFIC 100 and outputs the transmission signal Tx. The SubCTRL 201 controls, in accordance with a control command from a main controller (MainCTRL) 200 of the terminal, a transmission operation performed by the transmission circuit 21. Specifically, the SubCTRL 201 performs, as basic functions, serial communication with the MainCTRL 200, and control of components of the transmission circuit 21, such as bias control of the PA 211, in accordance with a control command from the MainCTRL 200. The transmission signal Tx output from the PA 211 is output from an ANT 11 via the MPX 23.

The reception circuit 22 includes at least a low noise amplifier circuit (LNA) 221, at least a filter circuit (Filter) 222, and at least a sub-controller (SubCTRL) 202. The LNA 221 outputs, to the RFIC 100, a reception signal Rx input from the ANT 11 via the MPX 23 and the Filter 222. The SubCTRL 202 controls, in accordance with a control command from the MainCTRL 200, a reception operation performed by the reception circuit 22. Specifically, the SubCTRL 202 performs, as basic functions, serial communication with the MainCTRL 200, and control of components of the reception circuit 22 in accordance with a control command from the MainCTRL 200.

In this embodiment, the MainCTRL 200 is configured to output individual control commands to the SubCTRL 201 of the transmission circuit 21 and the SubCTRL 202 of the reception circuit 22. In other words, for example, a transmission command to the transmission circuit 21 is output only to the SubCTRL 201 of the transmission circuit 21. Furthermore, for example, a reception command to the reception circuit 22 is output only to the SubCTRL 202 of the reception circuit 22.

In the configuration illustrated in FIG. 2, the MPX 23 is a 1-to-2 surface acoustic wave (SAW) duplexer. The MPX 23 includes a filter having a passband equal to a frequency band of a transmission signal Tx to be output from the transmission circuit 21. The transmission signal Tx output from the transmission circuit 21 is transmitted from the ANT 11 via the filter having the passband equal to the frequency band of the transmission signal Tx. Furthermore, the MPX 23 includes a filter having a passband equal to a frequency band of a reception signal Rx to be received by the reception circuit 22. The reception signal Rx received by the ANT 11 is output to the reception circuit 22 via the filter having the passband equal to the frequency band of the reception signal Rx. The present disclosure is not to be limited by configurations of the filters included in the MPX 23.

The Filter 222 has a passband equal to the frequency band of the reception signal Rx and is a constituent portion that performs, as a basic function, suppression of jamming waves, for example, from another high-frequency circuit and components that are included in the high-frequency signal transmission-reception circuit 1. Each of FIGS. 3A and 3B illustrates an example of an internal configuration of the filter circuit (Filter).

Figure 3A:
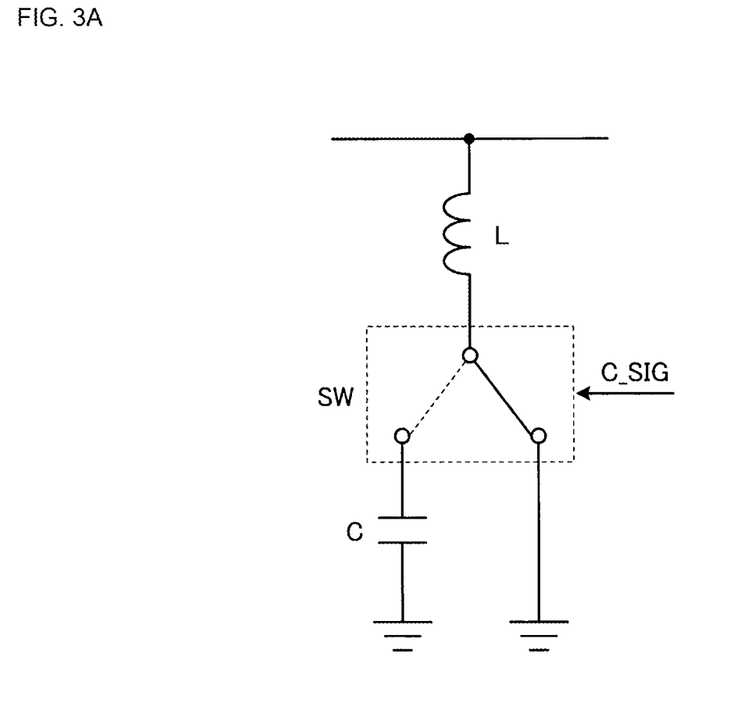
FIG. 3A illustrates an example of an internal configuration of a filter circuit.

As illustrated in FIG. 3A, the Filter 222 may include, for example, an LC series resonant circuit. In the configuration illustrated in FIG. 3A, the LC series resonant circuit is implemented when a SW is controlled by a control signal C_SIG, providing a notch filter having a frequency response in which attenuation reaches a maximum at a resonant frequency.

Figure 3B:
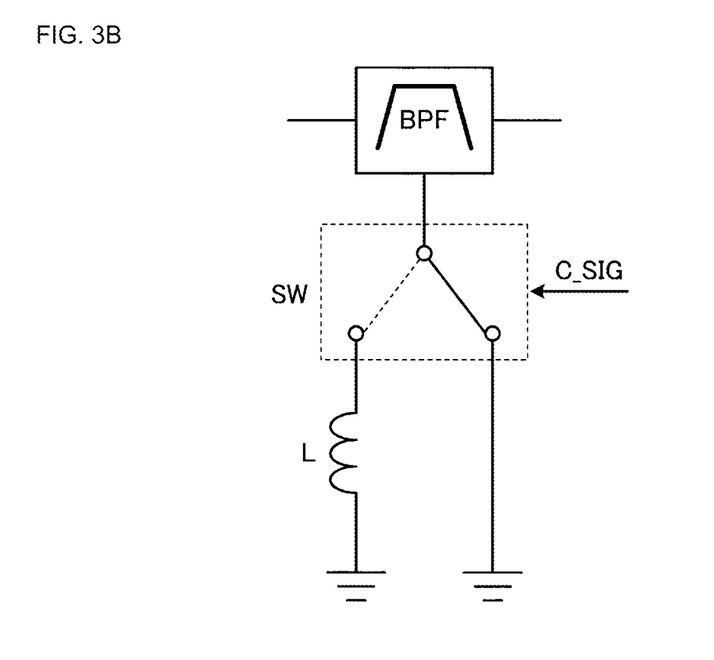
FIG. 3B illustrates an example of an internal configuration of the filter circuit.

Furthermore, as illustrated in FIG. 3B, the Filter 222 may include, for example, a band pass filter (BPF). In the configuration illustrated in FIG. 3B, an L component is added when the SW is controlled by a control signal C_SIG, and a frequency at which attenuation reaches a maximum changes.

The Filter 222 may include, as illustrated in FIG. 3A, the configuration in which an attenuation pole that causes attenuation to reach a maximum when the SW is controlled by the control signal C_SIG is generated, or may include, as illustrated in FIG. 3B, the configuration in which an attenuation pole frequency changes when the SW is controlled by the control signal C_SIG. The configuration of the Filter 222 is not limited to the configurations illustrated in FIGS. 3A and 3B. Examples of the configuration of the Filter 222 may include the configurations illustrated in FIGS. 3A and 3B, and a configuration including a filter element different from the configurations illustrated in FIGS. 3A and 3B.

In this embodiment, as described with reference to the configuration examples illustrated in FIGS. 3A and 3B, the frequency response of the Filter 222 changes when the SW is controlled by the control signal C_SIG.

Figure 4A:
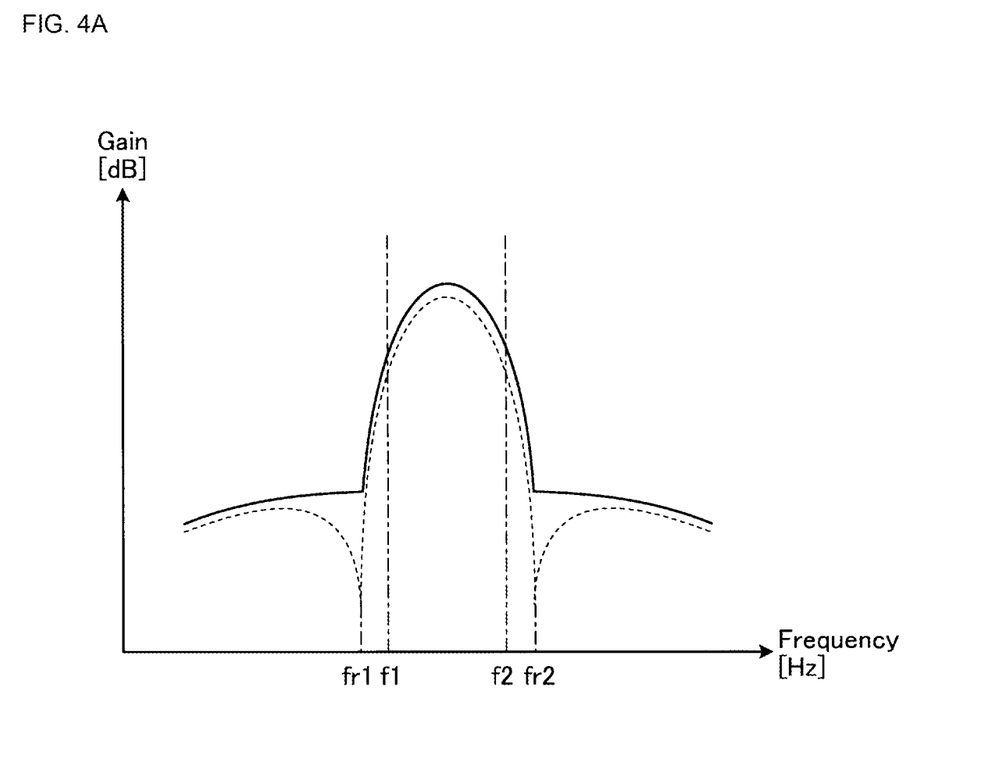
FIG. 4A illustrates an example of a reception sensitivity characteristic of a reception circuit.
Figure 4B:
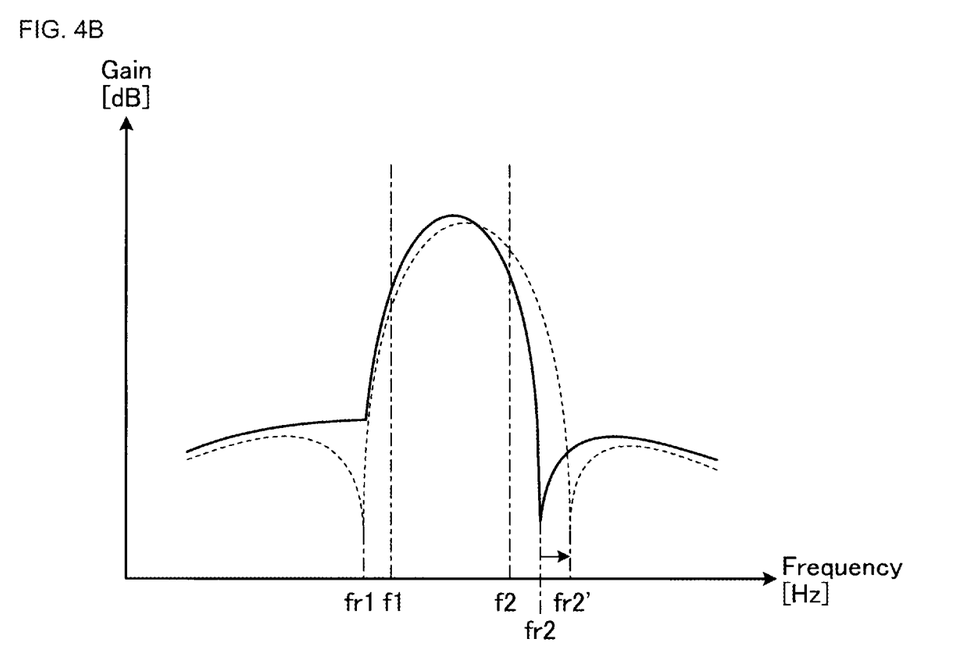
FIG. 4B illustrates an example of a reception sensitivity characteristic of the reception circuit.

Each of FIGS. 4A and 4B illustrates an example of a reception sensitivity characteristic of the reception circuit. In examples illustrated in FIGS. 4A and 4B, the horizontal axis represents frequency, and the vertical axis represents gain. Furthermore, in the examples illustrated in FIGS. 4A and 4B, a passband of the reception signal Rx to be received by the reception circuit 22 is indicated by f1-f2.

FIG. 4A illustrates an example where, when the Filter 222 is controlled by the control signal C_SIG, attenuation poles are generated at fr1 and fr2 outside the passband f1-f2 of the reception signal Rx.

FIG. 4B illustrates an example where, when the Filter 222 is controlled by the control signal C_SIG, an attenuation pole is generated at fr1 outside the passband f1-f2 of the reception signal Rx and an attenuation pole frequency is changed (to fr2') at fr2 outside the passband f1-f2 of the reception signal Rx. Incidentally, although FIG. 4B illustrates the example where the attenuation pole frequency is changed to a higher level, the attenuation pole frequency may be changed to a lower level. The present disclosure is not to be limited by a frequency at which an attenuation pole is provided.

In the above-described high-frequency signal transmission-reception circuit 1 according to Embodiment 1, the transmission signal Tx output from the transmission circuit 21 is superimposed on the reception path of the reception circuit 22 across the MPX 23, and deterioration of reception sensitivity may occur. Deterioration of reception sensitivity due to superimposition of the transmission signal Tx output from the transmission circuit 21 on the reception path of the reception circuit 22 across the MPX 23 will be described below with reference to FIG. 5.

Figure 5:
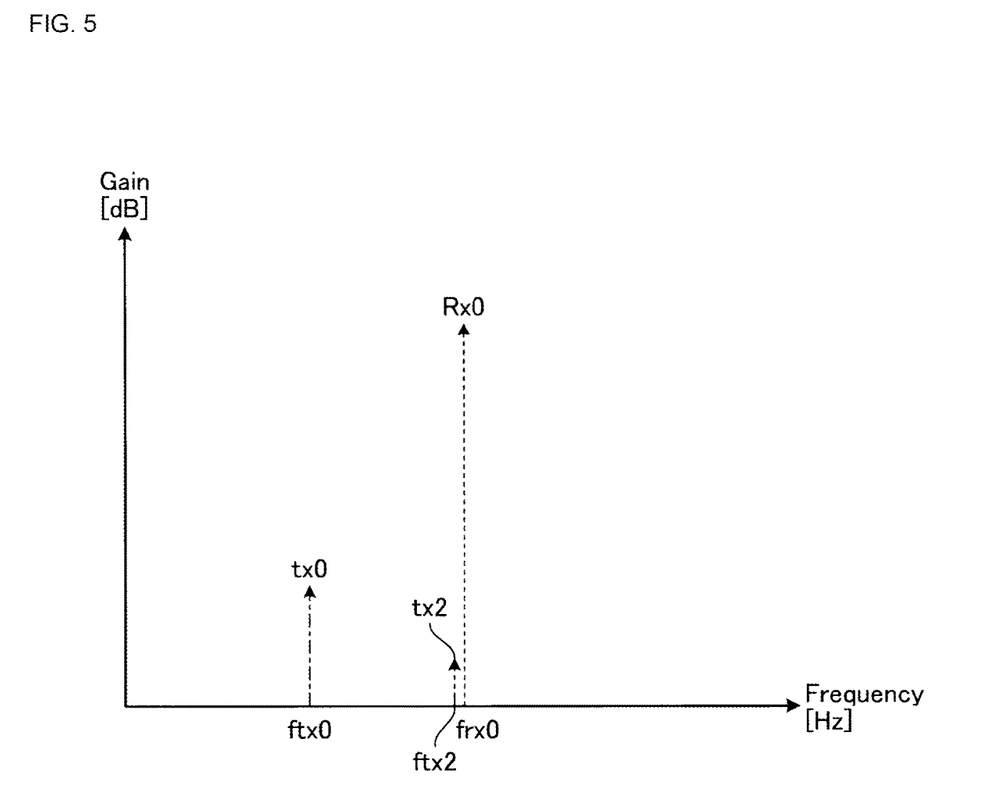
FIG. 5 illustrates an example of a factor in deterioration of reception sensitivity.

FIG. 5 illustrates an example of a factor in deterioration of reception sensitivity. In FIG. 5, a fundamental component of the reception signal Rx in the reception path of the reception circuit 22 is Rx0, a frequency of the fundamental component Rx0 of the reception signal Rx is frx0, a fundamental component of the transmission signal Tx is tx0, a frequency of the fundamental component tx0 of the transmission signal Tx is ftx0, a second harmonic component of the transmission signal Tx is tx2, and a frequency of the second harmonic component tx2 of the transmission signal Tx is ftx2.

As illustrated in FIG. 5, for example, if the second harmonic component tx2 of the transmission signal Tx exists near the fundamental component Rx0 of the reception signal Rx, the second harmonic component tx2 of the transmission signal Tx is superimposed, as a jamming wave, on the reception path of the reception circuit 22. The jamming wave can be a factor in deterioration of reception sensitivity for the reception signal Rx in the reception circuit 22.

Although the example has been described here where the second harmonic component tx2 of the transmission signal Tx is superimposed, as a jamming wave, on the reception path of the reception circuit 22, for example, the case where a third or higher-order harmonic component of the transmission signal Tx is superimposed, as a jamming wave, on the reception path of the reception circuit 22 can also be a factor in deterioration of reception sensitivity. The present disclosure is not to be limited by the mode of a jamming wave resulting from output of the transmission signal Tx, that is, from a transmission operation performed by the transmission circuit 21.

Thus, in this embodiment, in the case where the transmission circuit 21 is outputting the transmission signal Tx, that is, in the case where the transmission circuit 21 is performing a transmission operation, the frequency response of the Filter 222 is caused to serve as a frequency response that achieves the reception sensitivity characteristic represented by a dashed line in each of FIGS. 4A and 4B, that is, a frequency response that has an attenuation pole corresponding to a characteristic of a jamming wave resulting from the transmission operation performed by the transmission circuit 21 (for example, an attenuation pole that attenuates a harmonic component, such as the second harmonic component of the transmission signal Tx). This can suppress deterioration of reception sensitivity for the reception signal Rx in the reception circuit 22 due to a jamming wave (for example, a harmonic component, such as the second harmonic component of the transmission signal Tx) resulting from a transmission operation performed by the transmission circuit 21.

Incidentally, in the case where an attenuation pole is provided in the frequency response of the Filter 222, in some cases, the gain of the reception sensitivity characteristic decreases in the passband f1-f2 of the reception signal Rx as represented by the dashed line in each of FIGS. 4A and 4B.

Thus, in this embodiment, the case where the transmission circuit 21 is outputting the transmission signal Tx, that is, the case where the transmission circuit 21 is performing a transmission operation is caused to differ in the frequency response of the Filter 222 from the case where the transmission circuit 21 is not outputting the transmission signal Tx, that is, the case where the transmission circuit 21 is not performing a transmission operation. Specifically, for example, the configuration illustrated in FIGS. 3A and 3B is used in the Filter 222 to provide the SW, and the frequency response of the Filter 222 can be changed by controlling this SW.

In this embodiment, as described above, a transmission command from the MainCTRL 200 to the transmission circuit 21 is output only to the SubCTRL 201 of the transmission circuit 21. Hence, in this embodiment, the Filter 222 is controlled by the SubCTRL 201 of the transmission circuit 21.

Specifically, for example, in the case where the transmission circuit 21 is not performing a transmission operation, the SubCTRL 201 of the transmission circuit 21 controls the SW of the Filter 222 so that the frequency response of the Filter 222 serves as a first frequency response that achieves the reception sensitivity characteristic represented by a solid line in FIG. 4A. On the other hand, in the case where the transmission circuit 21 is performing a transmission operation, the SubCTRL 201 of the transmission circuit 21 controls the SW of the Filter 222 so that the frequency response of the Filter 222 serves as a second frequency response that achieves the reception sensitivity characteristic represented by the dashed line in FIG. 4A. In other words, the SubCTRL 201 of the transmission circuit 21 controls the Filter 222 so that attenuation poles are generated at the frequencies fr1 and fr2 outside the passband f1-f2 of the reception signal Rx.

Furthermore, for example, in the case where the transmission circuit 21 is not performing a transmission operation, the SubCTRL 201 of the transmission circuit 21 controls the SW of the Filter 222 so that the frequency response of the Filter 222 serves as a first frequency response that achieves the reception sensitivity characteristic represented by a solid line in FIG. 4B. On the other hand, in the case where the transmission circuit 21 is performing a transmission operation, the SubCTRL 201 of the transmission circuit 21 controls the SW of the Filter 222 so that the frequency response of the Filter 222 serves as a second frequency response that achieves the reception sensitivity characteristic represented by the dashed line in FIG. 4B. In other words, the SubCTRL 201 of the transmission circuit 21 controls the Filter 222 so that an attenuation pole is generated at the frequency fr1 outside the passband f1-f2 of the reception signal Rx and so that the attenuation pole frequency fr2 outside the passband f1-f2 of the reception signal Rx in the first frequency response is changed to a frequency fr2'.

This can suppress deterioration of reception sensitivity due to a jamming wave (for example, a harmonic component, such as the second harmonic component of the transmission signal Tx) resulting from a transmission operation performed by the transmission circuit 21 in the case where the transmission circuit 21 is performing the transmission operation. Furthermore, a decrease in gain in the passband f1-f2 of the reception signal Rx in the case where the transmission circuit 21 is not performing a transmission operation can be suppressed.

As described above, the high-frequency signal transmission-reception circuit according to Embodiment 1 includes the transmission circuit 21 that transmits a high-frequency signal (transmission signal Tx), the reception circuit 22 that receives a high-frequency signal (reception signal Rx), and the multiplexer (MPX) 23 that separates the reception path and the transmission path for high-frequency signals. In the reception circuit 22, the filter circuit (Filter) 222 in which frequency responses can be switched in accordance with a jamming wave for a high-frequency signal to be received is provided in the reception path for a high-frequency signal.

Specifically, the transmission circuit 21 includes the sub-controller (SubCTRL) 201 that controls a transmission operation in accordance with a control command from the main controller 200. The sub-controller (SubCTRL) 201 performs control so that the frequency response of the filter circuit (Filter) 222 serves as a first frequency response in the case where the transmission circuit 21 is not performing a transmission operation, and performs control so that the frequency response of the filter circuit (Filter) 222 serves as a second frequency response different from the first frequency response in the case where the transmission circuit 21 is performing a transmission operation.

In the above-described configuration, in the case where the transmission circuit 21 is performing a transmission operation, when the frequency response of the Filter 222 is caused to serve as the second frequency response having an attenuation pole corresponding to a characteristic of a jamming wave resulting from the transmission operation performed by the transmission circuit 21 (for example, an attenuation pole that attenuates a harmonic component, such as the second harmonic component of the transmission signal Tx), deterioration of reception sensitivity due to the jamming wave resulting from the transmission operation performed by the transmission circuit 21 can be suppressed.

Embodiment 2

Figure 6:
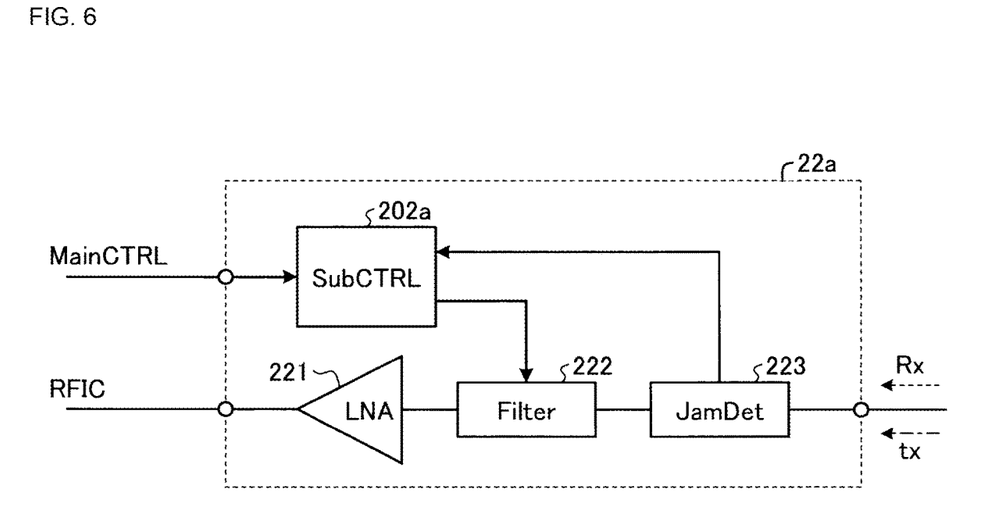
FIG. 6 illustrates an example of a schematic block configuration of a reception circuit according to Embodiment 2.

FIG. 6 illustrates an example of a schematic block configuration of a reception circuit according to Embodiment 2. Incidentally, a schematic configuration of a system using a high-frequency signal transmission-reception circuit, a schematic block configuration of a transmission circuit, and an internal configuration of a filter circuit (Filter) are similar to those in Embodiment 1, and illustration and description thereof are thus omitted.

A reception circuit 22a according to Embodiment 2 illustrated in FIG. 6 further includes a jamming wave detection circuit (JamDet) 223 in addition to the configuration of the reception circuit 22 according to Embodiment 1. The JamDet 223 is provided in a stage preceding the Filter 222 in a reception path of the reception circuit 22a.

The JamDet 223 is a constituent portion that detects a jamming wave superimposed on the reception path of the reception circuit 22a. Each of FIGS. 7A and 7B illustrates an example of a jamming wave detection circuit (JamDet).

Figure 7A:
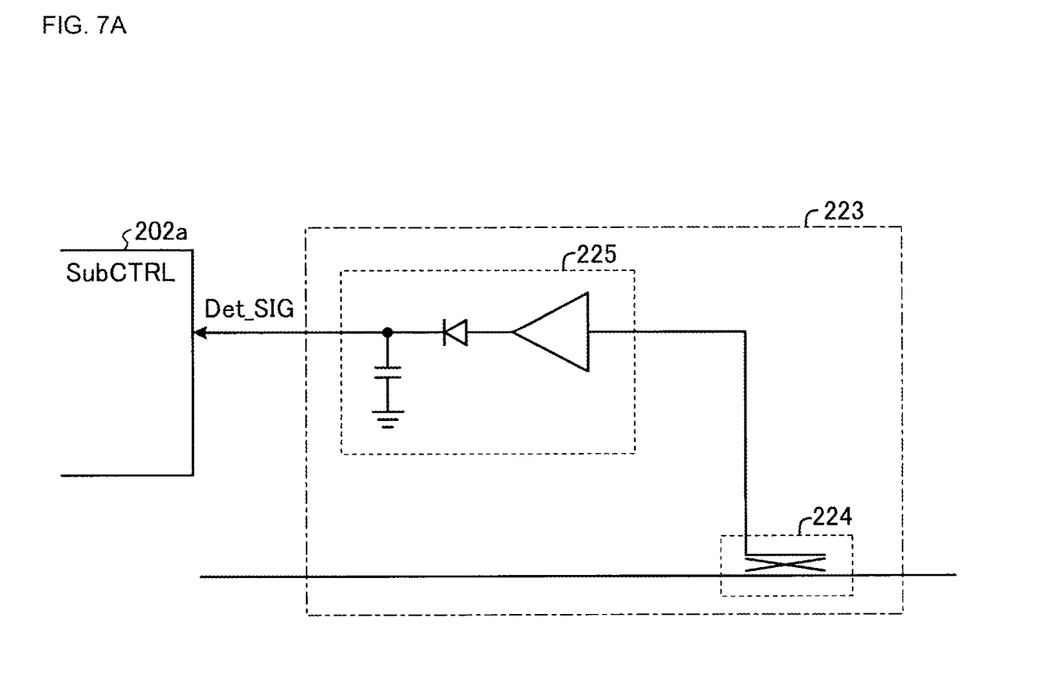
FIG. 7A illustrates an example of a jamming wave detection circuit.
Figure 7B:
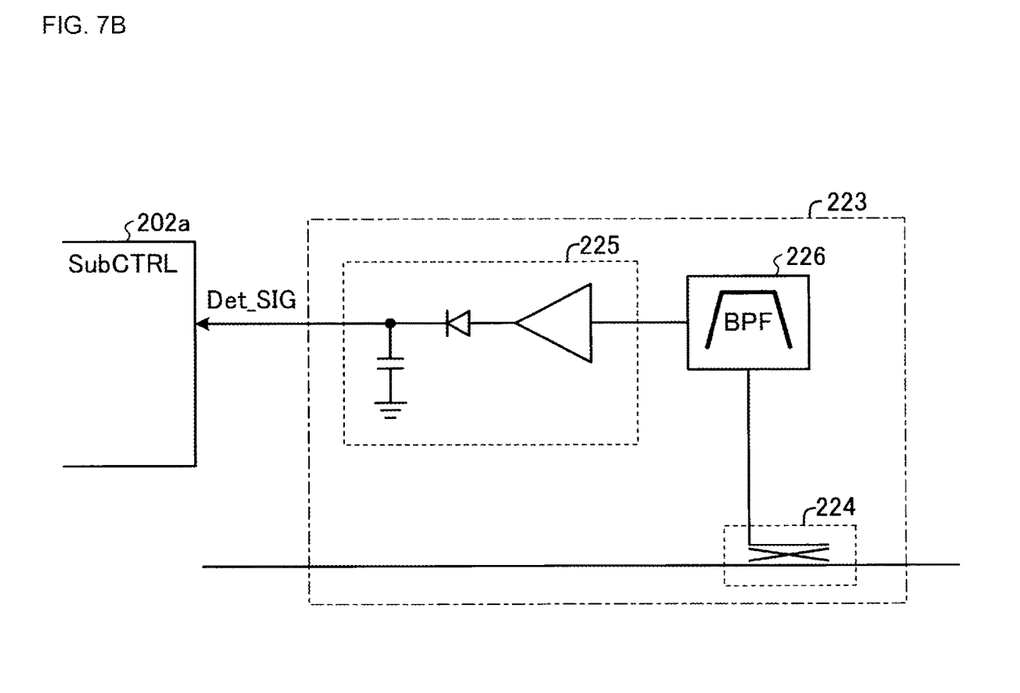
FIG. 7B illustrates an example of the jamming wave detection circuit.

As illustrated in FIGS. 7A and 7B, the JamDet 223 includes at least a coupler 224 and at least a detector circuit 225.

The coupler 224 couples a frequency band (for example, a band near the passband f1-f2 of the reception signal Rx illustrated in FIGS. 4A and 4B) that has been superimposed on the reception path and that can result in a jamming wave for the reception signal Rx, and transmits an output signal. Examples of a frequency band to be coupled by the coupler 224 desirably include a band of a harmonic component, such as the second harmonic component of the transmission signal Tx.

The detector circuit 225 detects the output of the coupler 224 and outputs a jamming wave detection signal Det_SIG. Incidentally, the configuration of the detector circuit 225 illustrated in FIGS. 7A and 7B is an example, and the configuration is not limited to this.

Furthermore, as illustrated in FIG. 7B, the JamDet 223 may include a bandpass filter circuit (BPF) 226 that passes a frequency band that can result in a jamming wave for the reception signal Rx from the output of the coupler 224.

In this embodiment, the Filter 222 of the reception circuit 22a is controlled by a sub-controller (SubCTRL) 202a of the reception circuit 22a.

Specifically, the SubCTRL 202a of the reception circuit 22a determines, in accordance with the jamming wave detection signal Det_SIG output from the JamDet 223, whether a jamming wave (for example, a harmonic component, such as the second harmonic component of the transmission signal Tx) has been superimposed on the reception path, and controls, in accordance with this determination result, the SW of the Filter 222 by using the control signal C_SIG.

More specifically, for example, in the case where a jamming wave has not been superimposed on the reception path of the reception circuit 22a, the SubCTRL 202a of the reception circuit 22a controls the SW of the Filter 222 so that the frequency response of the Filter 222 serves as the first frequency response that achieves the reception sensitivity characteristic represented by the solid line in FIG. 4A. On the other hand, in the case where a jamming wave has been superimposed on the reception path of the reception circuit 22a, the SubCTRL 202a of the reception circuit 22a controls the SW of the Filter 222 so that the frequency response of the Filter 222 serves as the second frequency response that achieves the reception sensitivity characteristic represented by the dashed line in FIG. 4A. In other words, the SubCTRL 202a of the reception circuit 22a controls the Filter 222 so that attenuation poles are generated at the frequencies fr1 and fr2 outside the passband f1-f2 of the reception signal Rx.

Furthermore, for example, in the case where a jamming wave has not been superimposed on the reception path of the reception circuit 22a, the SubCTRL 202a of the reception circuit 22a controls the SW of the Filter 222 so that the frequency response of the Filter 222 serves as the first frequency response that achieves the reception sensitivity characteristic represented by the solid line in FIG. 4B. On the other hand, in the case where a jamming wave has been superimposed on the reception path of the reception circuit 22a, the SubCTRL 202a of the reception circuit 22a controls the SW of the Filter 222 so that the frequency response of the Filter 222 serves as the second frequency response that achieves the reception sensitivity characteristic represented by the dashed line in FIG. 4B. In other words, the SubCTRL 202a of the reception circuit 22a controls the Filter 222 so that an attenuation pole is generated at the frequency fr1 outside the passband f1-f2 of the reception signal Rx and so that the attenuation pole frequency fr2 outside the passband f1-f2 of the reception signal Rx in the first frequency response is changed to the frequency fr2'.

Thus, regardless of whether the transmission circuit 21 is outputting the transmission signal Tx, that is, regardless of whether the transmission circuit 21 is performing a transmission operation, deterioration of reception sensitivity in the case where a jamming wave has been superimposed on the reception path of the reception circuit 22a can be suppressed. Furthermore, a decrease in gain in the passband f1-f2 of the reception signal Rx in the case where a jamming wave has not been superimposed on the reception path of the reception circuit 22a can be suppressed.

Incidentally, an aspect of Embodiment 1 and an aspect of Embodiment 2 can be combined. In other words, in the case where the transmission circuit 21 is performing a transmission operation, the SubCTRL 201 of the transmission circuit 21 controls the Filter 222, and in the case as well where the transmission circuit 21 is not outputting the transmission signal Tx, if it is detected by the jamming wave detection signal Det_SIG output from the JamDet 223 that a jamming wave has been superimposed on the reception path of the reception circuit 22a, the SubCTRL 202a of the reception circuit 22a may control the Filter 222.

As described above, the high-frequency signal transmission-reception circuit according to Embodiment 2 includes the transmission circuit 21 that transmits a high-frequency signal (transmission signal Tx), the reception circuit 22a that receives a high-frequency signal (reception signal Rx), and the multiplexer (MPX) 23 that separates the reception path and a transmission path for high-frequency signals. In the reception circuit 22a, the filter circuit (Filter) 222 in which frequency responses can be switched in accordance with a jamming wave for a high-frequency signal to be received is provided in the reception path for a high-frequency signal.

Specifically, the reception circuit 22a includes the sub-controller (SubCTRL) 202a that controls a reception operation in accordance with a control command from the main controller 200, and the jamming wave detection circuit 223 that is provided in a stage preceding the filter circuit (Filter) 222 and detects a jamming wave superimposed on the reception path. The sub-controller (SubCTRL) 202a performs control so that the frequency response of the filter circuit (Filter) 222 serves as a first frequency response in the case where no jamming wave has been detected by the jamming wave detection circuit 223, and performs control so that the frequency response of the filter circuit (Filter) 222 serves as a second frequency response different from the first frequency response in the case where a jamming wave has been detected by the jamming wave detection circuit 223.

In the above-described configuration, in the case where a jamming wave has been detected by the jamming wave detection circuit 223, when the frequency response of the Filter 222 is caused to serve as the second frequency response having an attenuation pole corresponding to a characteristic of a jamming wave (for example, an attenuation pole that attenuates a harmonic component, such as the second harmonic component of the transmission signal Tx), deterioration of reception sensitivity due to the jamming wave (for example, a harmonic component, such as the second harmonic component of the transmission signal Tx) can be suppressed.

The above-described embodiments are intended to facilitate understanding of the present disclosure but are not intended for a limited interpretation of the present disclosure. The present disclosure can be changed or improved without necessarily departing from the gist thereof and also includes equivalents thereof.

Furthermore, the present disclosure is as described above, or may employ the following configuration in place of the above.

(1) A high-frequency signal transmission-reception circuit according to one aspect of the present disclosure includes a high-frequency circuit configured to perform transmission and reception of high-frequency signals by using one or more antennas. The high-frequency circuit includes a transmission circuit configured to transmit a high-frequency signal, a reception circuit configured to receive a high-frequency signal, and a multiplexer configured to separate a reception path and a transmission path for high-frequency signals. In the reception circuit, a filter circuit in which a first frequency response and a second frequency response different from the first frequency response can be switched in accordance with a jamming wave for a high-frequency signal to be received is provided in the reception path for a high-frequency signal.

In this configuration, the frequency response of the filter circuit can be switched. Specifically, in the case where a jamming wave for a high-frequency signal to be received has been superimposed on the reception path, when an attenuation pole corresponding to a characteristic of the jamming wave is provided in the frequency response of the filter circuit, deterioration of reception sensitivity due to the jamming wave can be suppressed.

(2) In the high-frequency signal transmission-reception circuit according to (1), the transmission circuit includes a sub-controller configured to control a transmission operation in accordance with a control command from at least a main controller, and the reception circuit includes a sub-controller configured to control a reception operation in accordance with a control command from at least the main controller. The sub-controller of the transmission circuit performs control so that a frequency response of the filter circuit serves as the first frequency response in a case where the transmission circuit is not performing a transmission operation, and performs control so that the frequency response of the filter circuit serves as the second frequency response in a case where the transmission circuit is performing a transmission operation.

In this configuration, in the case where the transmission circuit is performing a transmission operation, when the frequency response of the filter circuit is caused to serve as the second frequency response obtained by providing an attenuation pole corresponding to a characteristic of a jamming wave resulting from the transmission operation performed by the transmission circuit in the frequency response of the filter circuit, deterioration of reception sensitivity due to the jamming wave resulting from the transmission operation performed by the transmission circuit can be suppressed.

(3) In the high-frequency signal transmission-reception circuit according to (1), the transmission circuit includes a sub-controller configured to control a transmission operation in accordance with a control command from at least a main controller, and the reception circuit includes a sub-controller configured to control a reception operation in accordance with a control command from at least the main controller, and a jamming wave detection circuit provided in a stage preceding the filter circuit and configured to detect a jamming wave superimposed on the reception path. The sub-controller of the reception circuit performs control so that a frequency response of the filter circuit serves as the first frequency response in a case where no jamming wave has been detected by the jamming wave detection circuit, and performs control so that the frequency response of the filter circuit serves as the second frequency response in a case where a jamming wave has been detected by the jamming wave detection circuit.

In this configuration, in the case where a jamming wave has been detected by the jamming wave detection circuit, when the frequency response of the filter circuit is caused to serve as the second frequency response obtained by providing an attenuation pole corresponding to a characteristic of the jamming wave in the frequency response of the filter circuit, deterioration of reception sensitivity due to the jamming wave can be suppressed.

(4) In the high-frequency signal transmission-reception circuit according to any of (1) to (3), the second frequency response may have an attenuation pole outside a passband of a high-frequency signal to be received.

(5) In the high-frequency signal transmission-reception circuit according to any of (1) to (4), the second frequency response may have an attenuation pole at a frequency different from a frequency of an attenuation pole in the first frequency response outside a passband of a high-frequency signal to be received.

(6) In the high-frequency signal transmission-reception circuit according to any of (1) to (5), the filter circuit may include an LC series resonant circuit.

(7) In the high-frequency signal transmission-reception circuit according to any of (1) to (6), the filter circuit may include a band pass filter circuit.

(8) In the high-frequency signal transmission-reception circuit according to any of (1) to (7), the jamming wave is a second harmonic component of a high-frequency signal transmitted by the transmission circuit, and the second frequency response has an attenuation pole that attenuates at least the second harmonic component.

Thus, deterioration of reception sensitivity due to a second harmonic component of a transmission signal can be suppressed.

The present disclosure enables, in a configuration in which transmission and reception are simultaneously performed by using at least one antenna, deterioration of reception sensitivity to be suppressed.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A high-frequency signal transmission-reception circuit comprising:
   a high-frequency circuit configured to perform transmission and reception of high-frequency signals with one or more antenna ports, the high-frequency circuit comprising:
   a transmission circuit configured to transmit a high-frequency signal;
   a reception circuit configured to receive a high-frequency signal;
   a multiplexer configured to separate a reception path and a transmission path for the high-frequency signals; and
   a filter circuit in the reception path, wherein the filter circuit is configured to selectively switch between a first frequency response and a second frequency response in accordance with a jamming wave for a high-frequency signal, the second frequency response being different than the first frequency response,
   wherein the transmission circuit comprises a sub-controller configured to control a transmission operation in accordance with a control command from at least a main controller,
   wherein the reception circuit comprises a sub-controller configured to control a reception operation in accordance with the control command from at least the main controller, and
   wherein the sub-controller of the transmission circuit is configured to:
   perform control so that the filter circuit has the first frequency response when the transmission circuit is not performing a transmission operation, and
   perform control so that the filter circuit has the second frequency response when the transmission circuit is performing a transmission operation.

2. The high-frequency signal transmission-reception circuit according to claim 1, wherein the second frequency response has an attenuation pole outside a passband of a high-frequency signal that is received.

3. The high-frequency signal transmission-reception circuit according to claim 1, wherein the second frequency response has an attenuation pole at a frequency different from a frequency of an attenuation pole of the first frequency response, the frequency of the attenuation pole of the first frequency response being outside a passband of a high-frequency signal that is received.

4. The high-frequency signal transmission-reception circuit according to claim 1, wherein the filter circuit comprises an LC series resonant circuit.

5. The high-frequency signal transmission-reception circuit according to claim 1, wherein the filter circuit comprises a band pass filter circuit.

6. The high-frequency signal transmission-reception circuit according to claim 1,
   wherein the jamming wave is a second harmonic component of a high-frequency signal transmitted by the transmission circuit, and
   wherein the second frequency response has an attenuation pole that attenuates at least the second harmonic component.

7. A high-frequency signal transmission-reception circuit, further comprising:
   a high-frequency circuit configured to perform transmission and reception of high-frequency signals with one or more antenna ports, the high-frequency circuit comprising:
   a transmission circuit configured to transmit a high-frequency signal;
   a reception circuit configured to receive a high-frequency signal;
   a multiplexer configured to separate a reception path and a transmission path for the high-frequency signals;
   a filter circuit in the reception path, wherein the filter circuit is configured to selectively switch between a first frequency response and a second frequency response in accordance with a jamming wave for a high-frequency signal, the second frequency response being different than the first frequency response; and
   a jamming wave detection circuit in a stage preceding the filter circuit, the jamming wave detection circuit being configured to detect the jamming wave superimposed in the reception path,
   wherein the transmission circuit comprises a sub-controller configured to control a transmission operation in accordance with a control command from at least a main controller, wherein the reception circuit comprises a sub-controller configured to control a reception operation in accordance with the control command from at least the main controller, and in accordance with the jamming wave detection circuit, and wherein the sub-controller of the reception circuit is configured to:
- perform control so that the filter circuit has the first frequency response when no jamming wave is detected by the jamming wave detection circuit, and
- perform control so that the filter circuit has the second frequency response when the jamming wave is detected by the jamming wave detection circuit.

8. The high-frequency signal transmission-reception circuit according to claim 7, wherein the second frequency response has an attenuation pole outside a passband of a high-frequency signal that is received.

9. The high-frequency signal transmission-reception circuit according to claim 7, wherein the second frequency response has an attenuation pole at a frequency different from a frequency of an attenuation pole of the first frequency response, the frequency of the attenuation pole of the first frequency response being outside a passband of a high-frequency signal that is received.

10. The high-frequency signal transmission-reception circuit according to claim 7, wherein the filter circuit comprises an LC series resonant circuit.

11. The high-frequency signal transmission-reception circuit according to claim 7, wherein the filter circuit comprises a band pass filter circuit.

12. The high-frequency signal transmission-reception circuit according to claim 7,
- wherein the jamming wave is a second harmonic component of a high-frequency signal transmitted by the transmission circuit, and
- wherein the second frequency response has an attenuation pole that attenuates at least the second harmonic component.

* * * * *